(12) United States Patent
Niu

(10) Patent No.: US 11,222,801 B2
(45) Date of Patent: Jan. 11, 2022

(54) TRANSFER METHOD AND TRANSFER APPARATUS

(71) Applicant: Au Optronics Corporation, Hsinchu (TW)

(72) Inventor: Tzu-Ling Niu, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 104 days.

(21) Appl. No.: 16/596,663

(22) Filed: Oct. 8, 2019

(65) Prior Publication Data

US 2020/0135524 A1 Apr. 30, 2020

(30) Foreign Application Priority Data

Oct. 26, 2018 (TW) .................................. 107137874

(51) Int. Cl.
*H01L 21/677* (2006.01)
*B65G 47/92* (2006.01)
*H01L 33/00* (2010.01)

(52) U.S. Cl.
CPC ........ *H01L 21/67709* (2013.01); *B65G 47/92* (2013.01); *H01L 21/67721* (2013.01); *H01L 33/005* (2013.01)

(58) Field of Classification Search
None
See application file for complete search history.

(56) References Cited

U.S. PATENT DOCUMENTS

| 7,052,924 | B2 | 5/2006 | Daniels et al. |
| 9,308,650 | B2 | 4/2016 | Eisele et al. |
| 9,548,233 | B2 | 1/2017 | Golda et al. |
| 9,698,160 | B2 | 7/2017 | Wu et al. |
| 9,772,459 | B2 | 9/2017 | Wu |
| 10,647,525 | B1* | 5/2020 | Ma .......................... B65G 47/91 |
| 2016/0336304 | A1 | 11/2016 | Wu et al. |
| 2017/0052336 | A1 | 2/2017 | Wu |
| 2017/0104009 | A1* | 4/2017 | Peng .................... H01L 27/1259 |
| 2018/0128438 | A1* | 5/2018 | Sreshta ................. F21V 15/012 |
| 2019/0115242 | A1 | 4/2019 | Yen et al. |

(Continued)

FOREIGN PATENT DOCUMENTS

| CN | 108109952 | 6/2018 |
| CN | 108682312 | 10/2018 |

(Continued)

OTHER PUBLICATIONS

"Office Action of China Counterpart Application" with English translation thereof, dated Mar. 31, 2020, p. 1-p. 16.

*Primary Examiner* — Gerald McClain

(74) *Attorney, Agent, or Firm* — JCIPRNET

(57) ABSTRACT

A pick-up device has a caves. A first magnetic force is capable of attracting micro-devices to move toward the caves of the pick-up device. The pick-up device is disposed on a pick-up roller, and the pick-up roller drives the caves of the pick-up device to move relative to the micro-devices. Given that the first magnetic force is provided, the pick-up device compresses the micro-devices, so that the micro-devices are fitted in place the micro-devices into the caves of the pick-up device, wherein a shape of the caves is the same as a shape of the micro-devices. The micro-devices are transferred from the caves of the pick-up device to a receiving device.

16 Claims, 11 Drawing Sheets

(56) References Cited

U.S. PATENT DOCUMENTS

2020/0165077 A1* 5/2020 Ma .................... B65G 47/92
2021/0005775 A1* 1/2021 Chen .................. H01L 24/95

FOREIGN PATENT DOCUMENTS

| CN | 108682312 A | * 10/2018 | |
|----|----|----|----|
| DE | 1956049 A1 | * 5/1971 | ............ A47L 21/02 |
| TW | I557831 | 11/2016 | |
| TW | I624957 | 5/2018 | |

* cited by examiner

TRANSFER METHOD AND TRANSFER APPARATUS

CROSS-REFERENCE TO RELATED APPLICATION

This application claims the priority benefit of Taiwan application serial no. 107137874, filed on Oct. 26, 2018. The entirety of the above-mentioned patent application is hereby incorporated by reference herein and made a part of this specification.

BACKGROUND

Technical Field

The disclosure relates to a transfer method and a transfer apparatus.

Description of Related Art

A mass transfer technology for transferring micro-devices has been applied in the emerging manufacturing process of an electronic device. The manufacturing process of a light-emitting diode (LED) display apparatus is taken as an example. The manufacturing process of the LED display apparatus includes following steps: providing an elastic transfer head having a plurality of transfer bumps; providing an LED array; having the transfer bumps of the elastic transfer head contact with a plurality of LEDs of the LED array and picking up the LEDs; transferring the LEDs to a receiving device by using the elastic transfer head, so as to completely form the LED display apparatus. However, if the transfer process is to be expanded in scale, the transfer method using the elastic transfer head having the transfer bumps faces issues of insufficient manufacturing yield, inaccuracy, and difficulty in mass production.

SUMMARY

The disclosure provides a transfer method and a transfer apparatus with high manufacturing yield.

In an embodiment of the disclosure, a transfer method includes following steps. A pick-up device having a plurality of caves is provided. A first magnetic force configured to attract a plurality of micro-devices to move toward the caves of the pick-up device is provided. Given that the first magnetic force is provided, the pick-up device is in contact with the micro-devices, so as to snap the micro-devices by the caves of the pick-up device. The micro-devices are transferred from the caves of the pick-up device to a receiving device.

In an embodiment of the disclosure, a transfer apparatus includes a pick-up device, a first magnetic device, and a control device. The pick-up device has a plurality of caves. At least a part of the pick-up device is disposed between the first magnetic device and the micro-devices. The first magnetic device is configured to provide a first magnetic force configured to attract the micro-devices to move toward the caves of the pick-up device. Given that the first magnetic device provides the first magnetic force, the control device has the pick-up device contact the micro-devices, so as to snap the micro-devices by the caves of the pick-up device.

In view of the above, while the micro-devices are being transferred, the micro-devices are accurately positioned in the caves because of the balance of the first magnetic force and the mechanical force between the micro-devices and the pick-up device. The micro-devices in the caves of the pick-up device are then transferred to the receiving device through gravure printing or in other similar manner. Thereby, the micro-devices can be accurately aligned to the receiving device, so as to improve the manufacturing yield.

To make the above features and advantages described in one or more of the embodiments provided in the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
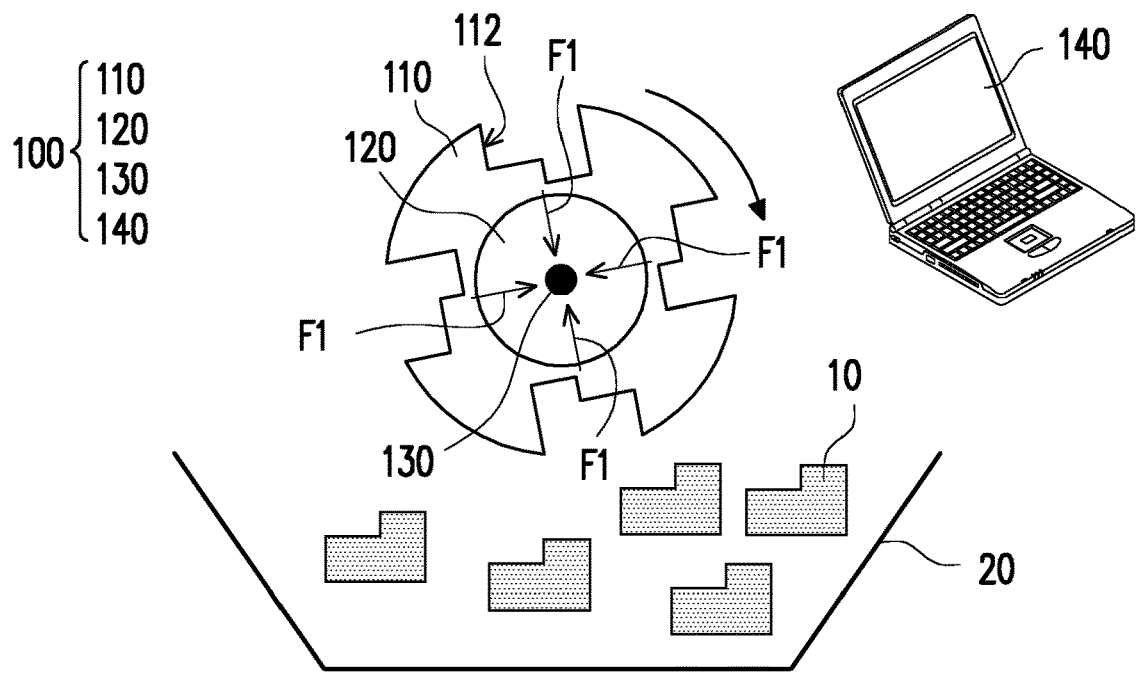
FIG. 1A-FIG. 1F are schematic flow charts illustrating a process of transferring a plurality of micro-devices according to an embodiment of the disclosure.

Descriptions of the invention are given with reference to the exemplary embodiments illustrated with accompanied drawings, wherein same or similar parts are denoted with same reference numerals. Wherever possible, the same reference numbers are used in the drawings and the description to refer to the same or like parts.

It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there is no intervening element present. As used herein, the term "connected" may refer to physically connected and/or electrically connected. Besides, "electrical connection" or "coupling" may be referred to as an intervening element existing between two elements.

The term "about," "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1A-FIG. 1F are schematic flow charts illustrating a process of transferring a plurality of micro-devices according to an embodiment of the disclosure. With reference to FIG. 1A-FIG. 1F, the process of transferring a plurality of micro-devices 10 includes a filling process depicted in FIG. 1A-FIG. 1C and a bonding process depicted in FIG. 1D-FIG. 1F, and the following explanations are given with reference to the drawings.

As shown in FIG. 1A, during the filling process, a plurality of micro-devices 10 and at least one carrier 20 are provided. In the present embodiment, the micro-devices 10 may be mini-LEDs, micro-LEDs, or LEDs of other sizes. Note that the micro-devices 10 are not limited to the LEDs; in other embodiments, the micro-devices 10 can also be other types of devices that can be mass transferred. In the present embodiment, the micro-devices 10 can be disposed on one carrier 20. For instance, the carrier 20 may be a tank, which should however not be construed as a limitation in the disclosure; in other embodiments, the carrier 20 can also be another appropriate component including but not limited to a blue tape.

With reference to FIG. 1A, a transfer apparatus 100 is then applied to pick up the micro-devices 10. The transfer apparatus 100 includes a pick-up device 110. The pick-up device 110 has a plurality of caves 112. The micro-devices 10 are snapped by the caves 112. That is, the caves 112 are configured to be engaged with the micro-devices 10. For instance, in the present embodiment, at least a partial contour of each of the caves 112 may be identical or similar to at least a partial contour of each of the micro-devices 10, which should however not be construed as a limitation in the disclosure. In the present embodiment, a material of the pick-up device 110 is preferably a material with elasticity and includes but is not limited to polyurethanes (PU) resin cured by ultraviolet.

With reference to FIG. 1A, the transfer apparatus 100 further includes a first magnetic device 120. At least one portion of the pick-up device 110 is disposed between the first magnetic device 120 and the micro-devices 10. The first magnetic device 120 is configured to provide a first magnetic force F1 to attract the micro-devices 10 to move toward the caves 112 of the pick-up device 110. In the present embodiment, the micro-devices 10 have the magnetic material or components that can be magnetized (e.g., including but not limited to LED electrodes), and therefore the micro-devices 10 are attracted to the first magnetic device 120.

In the present embodiment, the transfer apparatus 100 can further optionally include a pick-up roller 130. The pick-up device 110 is disposed on the pick-up roller 130. In the present embodiment, the first magnetic device 120 can be optionally disposed between the pick-up roller 130 and the pick-up device 110, which should however not be construed as a limitation in the disclosure. In other embodiments, the first magnetic device 120 can also be disposed at another appropriate location; for instance, the first magnetic device 120 may be integrated with the pick-up roller 130.

With reference to FIG. 1A, in the present embodiment, each of the caves 112 of the pick-up device 110 and the pick-up roller 130 can be arranged in one radial direction, and the first magnetic force F1 may be optionally parallel to the radial direction, which should however not be construed as a limitation in the disclosure. How the first magnetic device 120 is implemented is exemplified below with reference to FIG. 2, FIG. 3, and FIG. 4.

Figure 2:
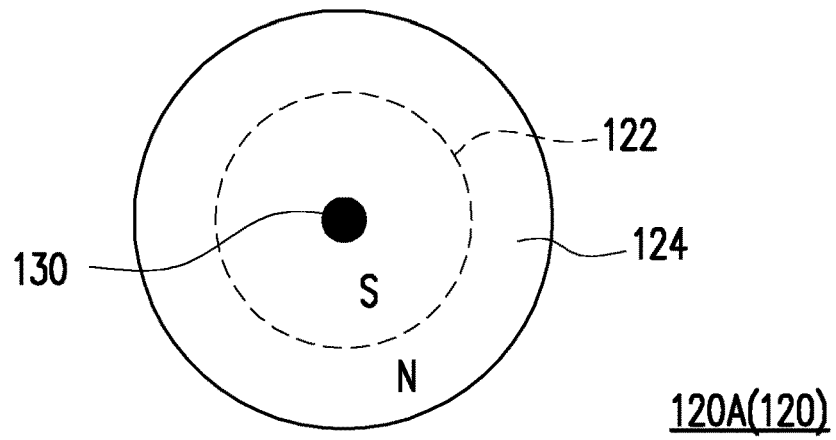
FIG. 2 illustrates a first magnetic device of a transfer apparatus according to an embodiment of the disclosure.

FIG. 2 illustrates a first magnetic device of a transfer apparatus according to an embodiment of the disclosure. In the embodiment depicted in FIG. 2, the first magnetic device 120A can optionally be a permanent magnet having a first magnetic pole 122 (e.g., S pole) and a second magnetic pole 124 (e.g., N pole). With reference to FIG. 1A and FIG. 2, if the first magnetic device 120A is applied in the embodiment depicted in FIG. 1A, the second magnetic pole 124 can optionally surround the first magnetic pole 122, so as to provide the first magnetic force F1 parallel to the radial direction, which should however not be construed as a limitation in the disclosure.

Figure 3:
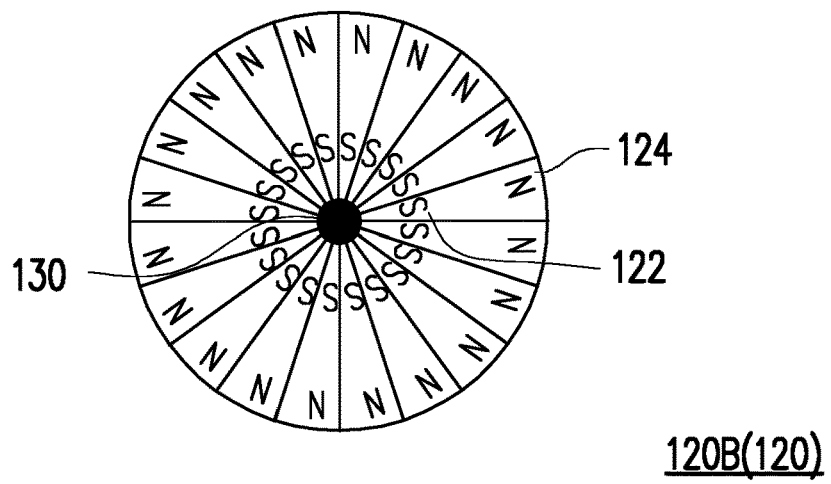
FIG. 3 illustrates a first magnetic device of a transfer apparatus according to another embodiment of the disclosure.

FIG. 3 illustrates a first magnetic device of a transfer apparatus according to another embodiment of the disclosure. In the embodiment depicted in FIG. 3, the first magnetic device 120B can be composed of a plurality of permanent magnets, wherein each of the permanent magnets has one first magnetic pole 122 (e.g., S pole) and one second magnetic pole 124 (e.g., N pole) opposite to the first magnetic pole 122. With reference to FIG. 1A and FIG. 3, if the first magnetic device 120B is applied in the embodiment depicted in FIG. 1A, the second magnetic poles 124 of the permanent magnets can optionally surround the first magnetic poles 122 of the permanent magnets, so as to provide the first magnetic force F1 parallel to the radial direction.

Figure 4:
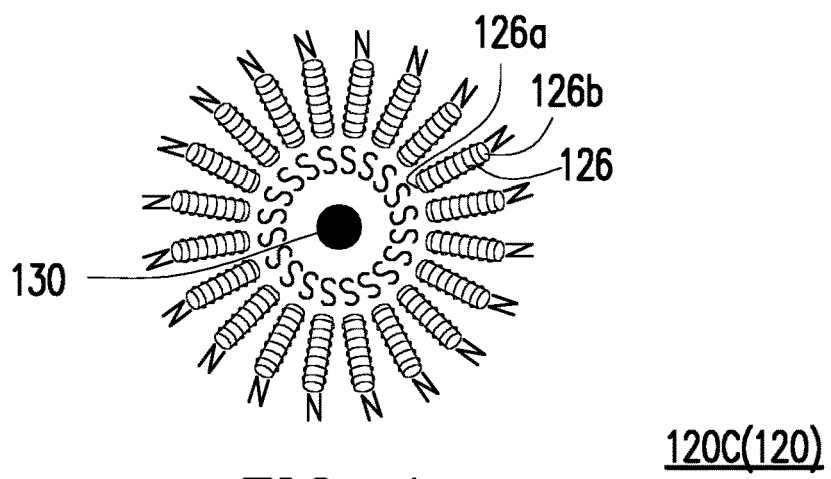
FIG. 4 illustrates a first magnetic device of a transfer apparatus according to still another embodiment of the disclosure.

FIG. 4 illustrates a first magnetic device of a transfer apparatus according to still another embodiment of the disclosure. In the embodiment depicted in FIG. 4, the first magnetic device 120C can be constituted by at least one electromagnet, each of which has one first magnetic pole 126a (e.g., S pole) and one second magnetic pole 126b (e.g., N pole) opposite to the first magnetic pole 126a. For instance, each electromagnet may include a coil 126 carrying a current, which should however not be construed as a limitation in the disclosure. With reference to FIG. 1A and FIG. 4, if the first magnetic device 120C is applied in the embodiment depicted in FIG. 1A, the first magnetic device 120C can include a plurality of electromagnets, and second magnetic poles 126b of the electromagnets can optionally surround first magnetic poles 126a of the electromagnets, so as to provide the first magnetic force F1 parallel to the radial direction, which should however not be construed as a limitation in the disclosure.

Figure 1B:
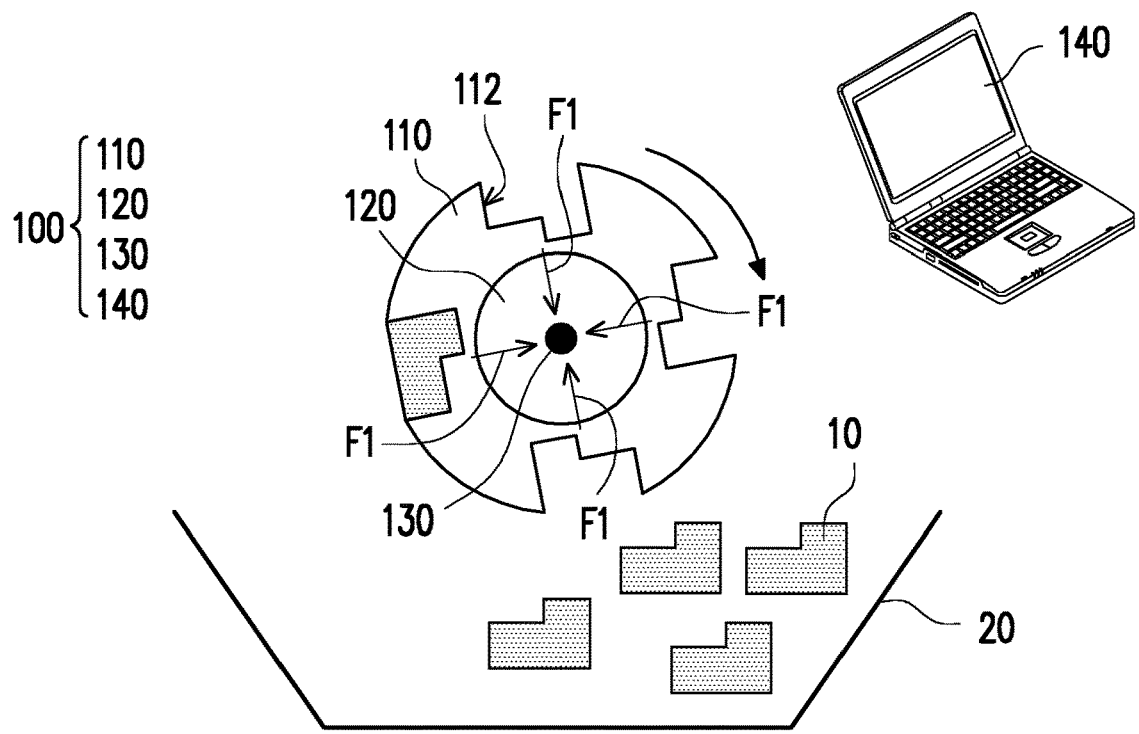
Figure 1C:
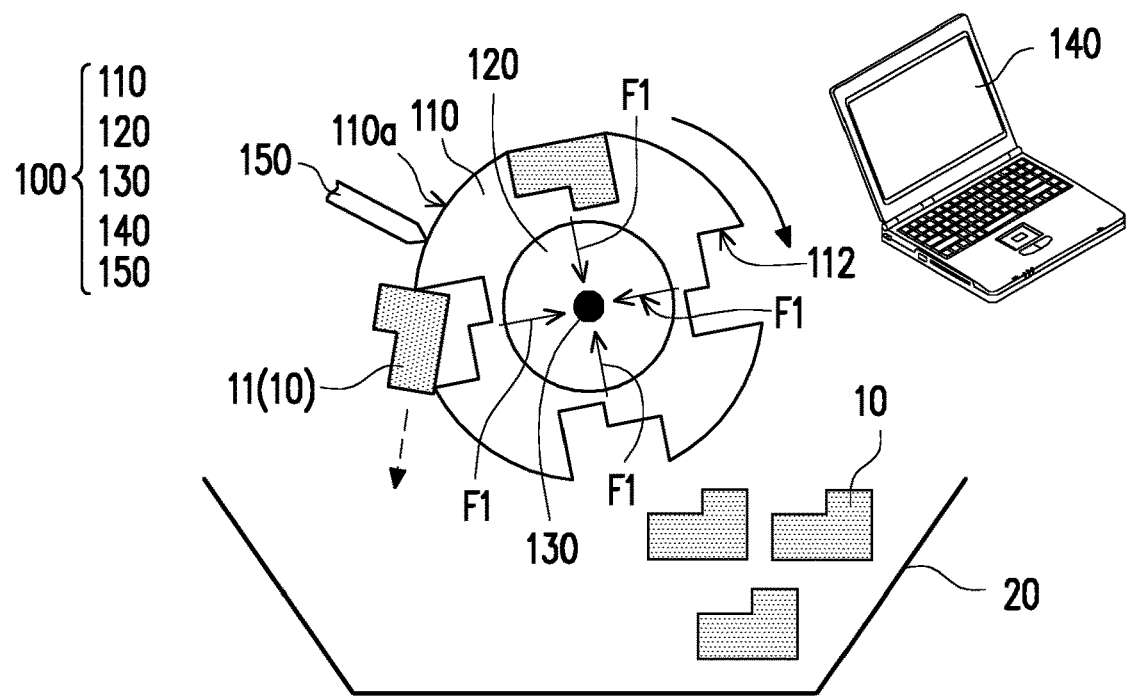

With reference to FIG. 1B and FIG. 1C, given that the first magnetic force F1 is provided, the pick-up device 110 is in contact with the micro-devices 10, so as to snap the micro-devices 10 by the caves 112 of the pick-up device 110.

Particularly, the transfer apparatus 100 further includes a control device 140. Given that the first magnetic device 120 provides the first magnetic force F1, the control device 140 has the pick-up device 110 contact the micro-devices 10, so as to snap the micro-devices 10 by the caves 112 of the pick-up device 110. For instance, in the present embodiment, the control device 140 (e.g., including but not limited to a computer) can have the pick-up roller 130 rotate and move toward the micro-devices 10 through proper components (e.g., motor, gear, etc.), so that the pick-up device 110 on the pick-up roller 130 is in contact with the micro-devices 10. After the pick-up device 110 is in contact with the micro-devices 10, the pick-up roller 130 drives the caves 112 of the pick-up device 110 to move (e.g., rotate) relative to the micro-devices 10 and further picks up the micro-devices 10.

While the pick-up device 110 is picking up the micro-devices 10, through the mechanical force between the micro-devices 10 and the caves 112 of the pick-up device 110, the micro-devices 10 and the caves 112 can be roughly geometrically aligned. When the pick-up device 110 is in contact with the micro-devices 10, the first magnetic force F1 is exerted to the micro-devices 10, so as to accurately align the micro-devices 10 and the caves 112.

With reference to FIG. 1C, after the pick-up device 110 picks up the micro-devices 10, and before the micro-devices 10 are transferred to the receiving device 30 (shown in FIG. 1D), if there is any misalignment between the micro-device 11 and the caves of the pick-up device 110, and parts of the micro-device 11 are located outside the caves 112, the misaligned micro-device 11 can be optionally removed. In particular, the transfer apparatus 100 further includes a removal device 150. In the present embodiment, the removal device 150 is, for instance, a blade, which can be directly and slightly in contact with a surface 110a of the pick-up device 110. When the blade moves relative to the pick-up device 110 (e.g., the blade is fixed and the pick-up device 110 is rotated), the blade can remove the misaligned micro-device 11 from the pick-up device 110. However, the disclosure is not limited thereto. In other embodiments, the removal device 150 can also be a component of another type, e.g., a magnetic device capable of providing a removal magnetic force, wherein a resultant force of the removal magnetic force and the first magnetic force F1 is pointed at a direction away from the pick-up device 110.

Figure 1D:
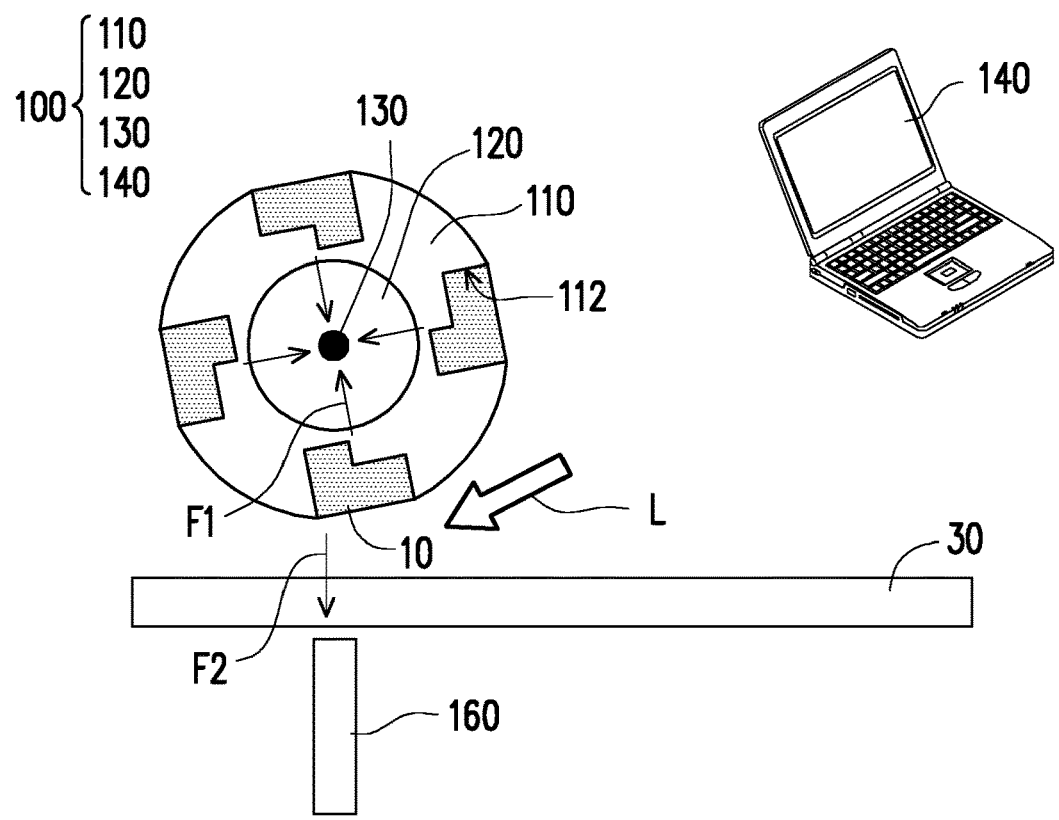
Figure 1E:
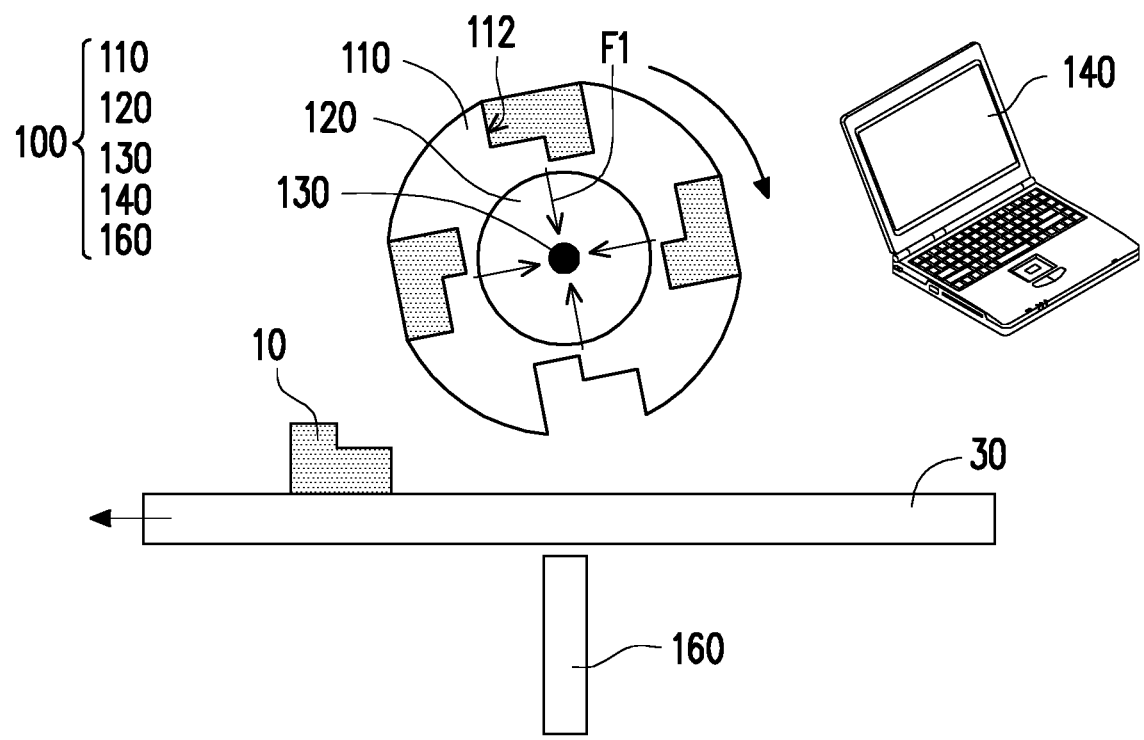
Figure 1F:
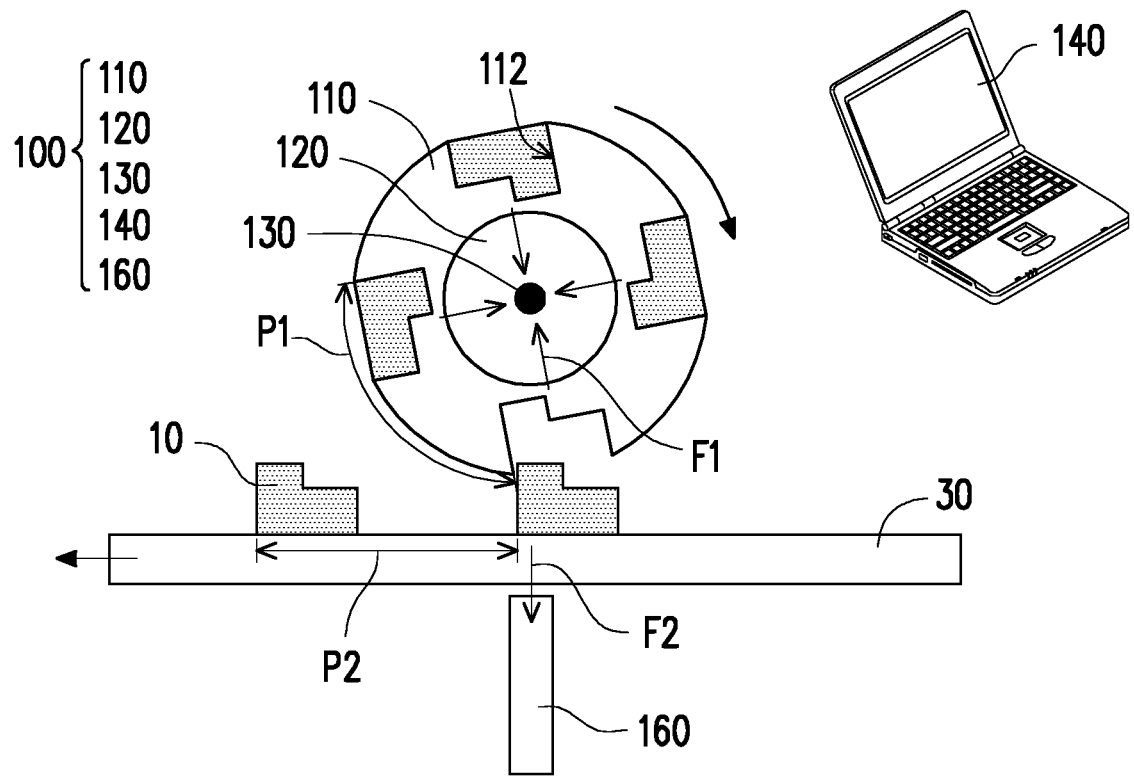

With reference to FIG. 1D-FIG. 1F, after the filling process is completed (i.e., after the caves 112 of the pick-up device 110 are respectively filled with the micro-devices 10), a bonding process is performed. With reference to FIG. 1D, the micro-devices 10 are separated from the caves 112 of the pick-up device 110. In the present embodiment, a second magnetic force F2 can be provided, so as to separate the micro-devices 10 from the caves 112 of the pick-up device 110. For instance, before the micro-devices 10 are transferred to the receiving device 30, the first magnetic force F1 may optionally act on the micro-devices 10 arranged in the caves 112, a direction of the second magnetic force F2 is opposite to a direction of the first magnetic force F1, and a magnitude of the second magnetic force F2 is greater than a magnitude of the first magnetic force F1. That is, a resultant force of the first magnetic force F1 and the second magnetic force F2 is pointed at a direction away from the pick-up device 110 and toward the receiving device 30. Thereby, the micro-devices 10 can be transferred from the caves 112 of the pick-up device 110 to the receiving device 30. In the present embodiment, the receiving device 30 is, for instance, a driving circuit substrate, and the micro-devices 10 and the receiving device 30 can be electrically connected to each other, so as to form an LED display panel, which should however not be construed as a limitation in the disclosure.

For instance, in the present embodiment, the second magnetic force F2 can be provided by the second magnetic device 160. The transfer apparatus 100 provided in the present embodiment can optionally include a second magnetic device 160, wherein the receiving device 30 can be disposed between the pick-up device 110 and the second magnetic device 160. However, the disclosure is not limited thereto. In other embodiments, the second magnetic force F2 can also be provided by the receiving device 30 itself (e.g., a conductive wire of the driving circuit substrate carrying an electric current).

With reference to FIG. 1D, in the present embodiment, before the micro-devices 10 are separated from the caves 112 and/or while the micro-devices 10 are being separated from the caves 112, laser L may be optionally utilized to melt a solder material (not shown) formed on the micro-devices 10 and/or the receiving device 30 in advance. Thereby, while the micro-devices 10 are being transferred to from the caves 112 to the receiving device 30, the micro-devices 10 can be electrically connected to the receiving device 30. However, the disclosure is not limited thereto. In other embodiments, it is also likely to electrically connect the micro-devices 10 to the receiving substrate 30 after the micro-devices 10 are transferred to the receiving substrate 30.

With reference to FIG. 1E and FIG. 1F, steps shown in FIG. 1D are repeatedly performed until the micro-devices 10 snapped by the caves of the pick-up device 110 are all transferred to the receiving device 30; as such, the process of transferring the micro-devices 10 is completed.

While the micro-devices 10 are being transferred, note that the micro-devices 10 are accurately positioned in the caves 112 because of the balance of the first magnetic force F1 and the mechanical force between the micro-devices 10 and the pick-up device 110. The micro-devices 10 in the caves 112 of the pick-up device 110 are then transferred to the receiving device 30 through gravure printing or in other similar manner. Thereby, the micro-devices 10 can be accurately aligned to the receiving device 30, and the manufacturing yield can be further improved.

Besides, according to the present embodiment, the pick-up device 110 is disposed on the pick-up roller 130, and the micro-devices 10 filling the caves 112 of the pick-up device 110 are transferred to the receiving device 30 through the rotation of the pick-up roller 130. Therefore, the micro-devices 10 can be efficiently transferred at a fast speed.

FIG. 5A-FIG. 5E are schematic flow charts illustrating a process of transferring a plurality of micro-devices according to another embodiment of the disclosure. The process of transferring the micro-devices 10 depicted in FIG. 5A-FIG. 5E is similar to the process of transferring the micro-devices 10 depicted in FIG. 1A-FIG. 1F, while the main difference therebetween lies in that the pick-up device 110D of the transfer apparatus 100D applied in the embodiment shown in FIG. 5A-FIG. 5E may adopt a planar intaglio plate for gravure printing. The process of transferring the micro-devices 10 depicted in FIG. 5A-FIG. 5E is briefly explained below.

Figure 5A:
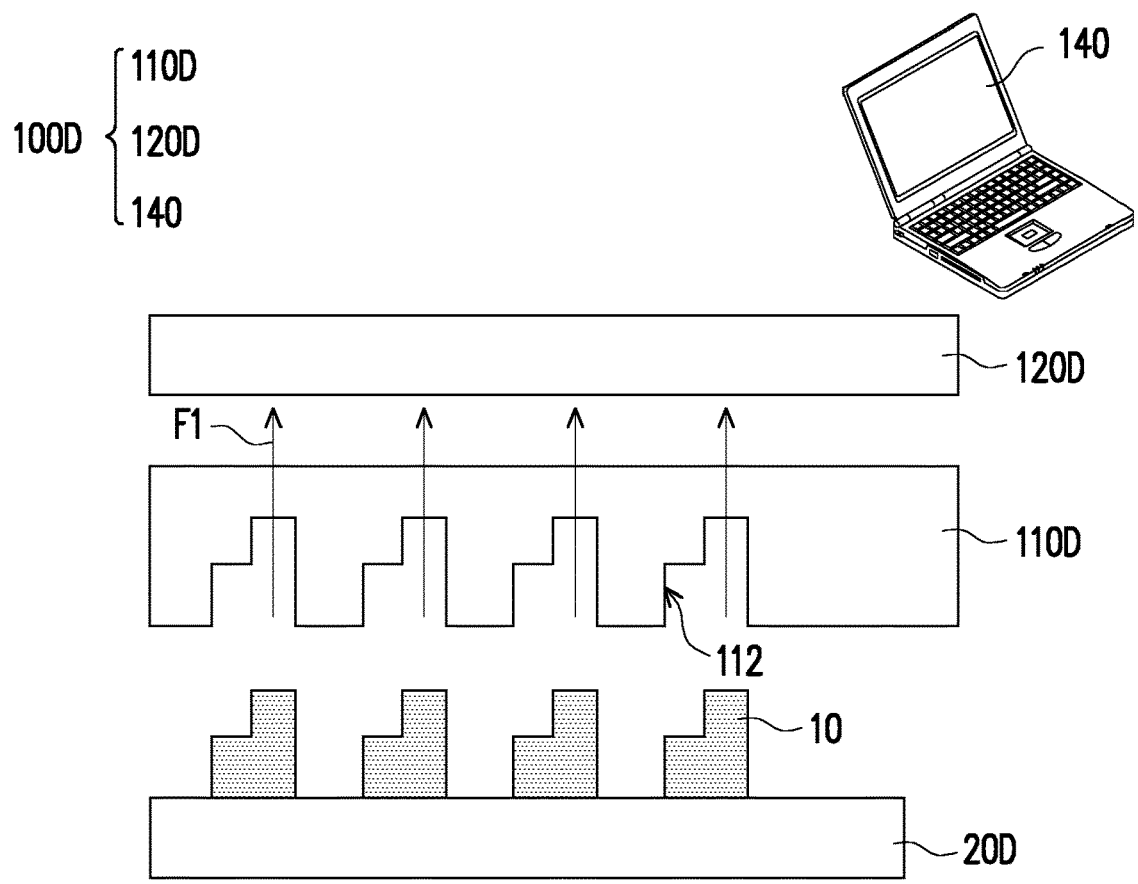
FIG. 5A-FIG. 5E are schematic flow charts illustrating a process of transferring a plurality of micro-devices according to another embodiment of the disclosure.

With reference to FIG. 5A, the micro-devices 10 and at least one carrier 20D are provided. In the present embodiment, to comply with the shape of the pick-up device 110D, the shape of the carrier 20D can be optionally of a plate shape, which should however not be construed as a limitation in the disclosure.

Figure 5B:
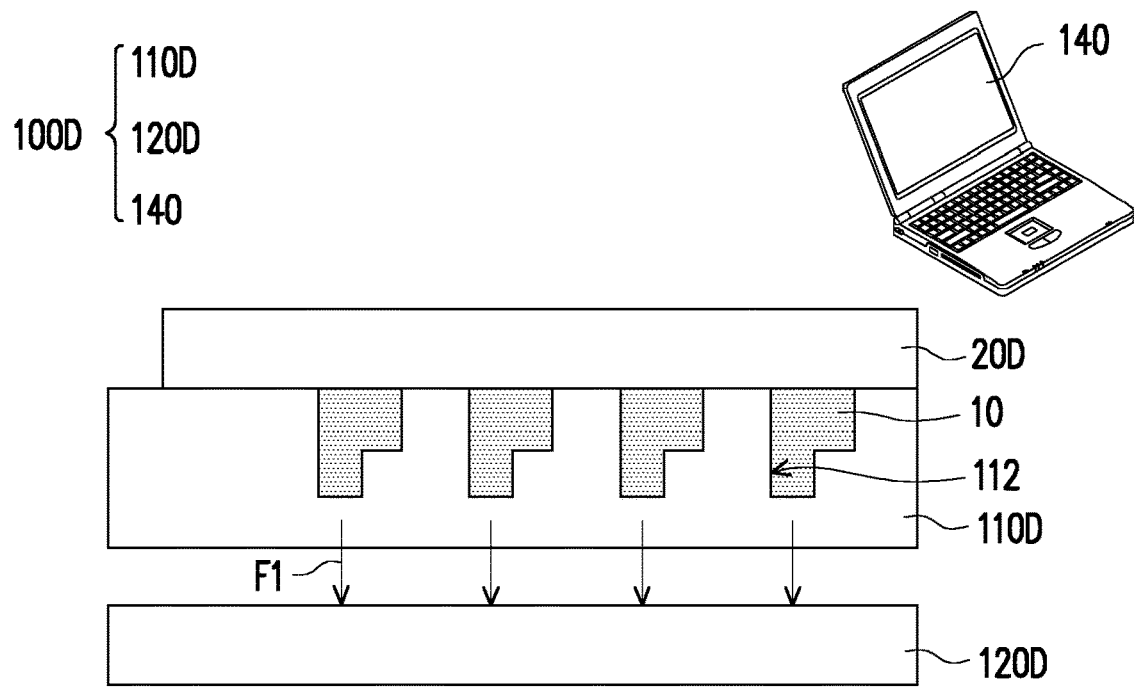
Figure 5C:
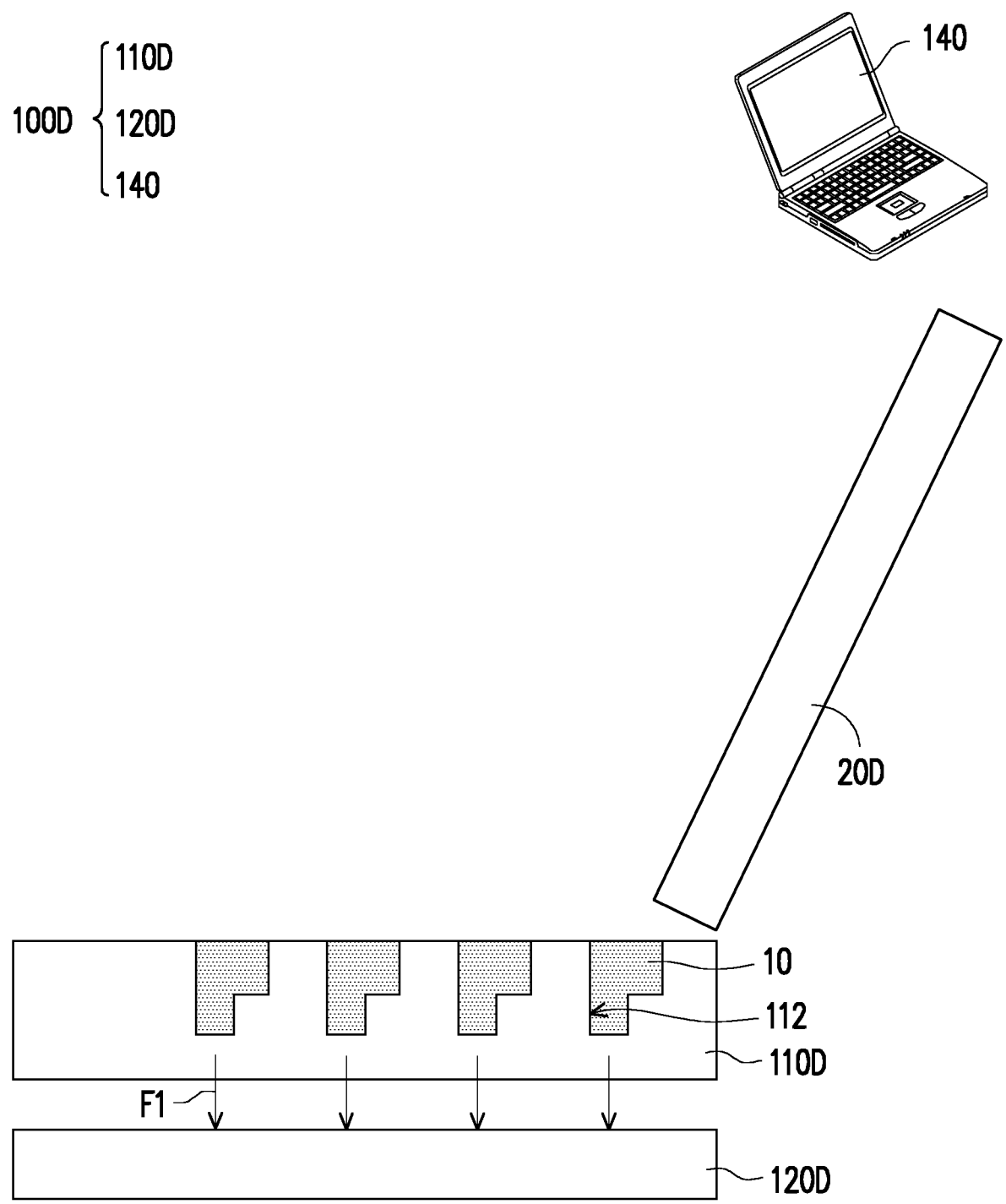

With reference to FIG. 5A, FIG. 5B, and FIG. 5C, the transfer apparatus 100D is then applied to pick up the micro-devices 10. The transfer apparatus 100D includes a pick-up device 110D. The pick-up device 110D has a plurality of caves 112, and the micro-devices 10 are snapped by the caves 112. In the present embodiment, a material of the contact conductors 110 is aluminum, for example, but the present invention is not limited thereto.

With reference to FIG. 5A and FIG. 5B, in particular, the micro-devices 10 can be snapped by the caves 112. In the present embodiment, while the micro-devices 10 are being snapped by the caves 112, the first magnetic force F1 provided by the first magnetic device 120D can be optionally utilized to attract the micro-devices 10 to move toward the caves 112 of the pick-up device 110D, so as to more accurately snap the micro-devices 10 to the caves 112 of the pick-up device 110D. However, the disclosure is not limited thereto. In other embodiments, while the micro-devices 10 are being snapped by the caves 112, it is likely not to exert the first magnetic force F1 to attract the micro-devices 10 but only exert the mechanical force between the caves 112 of the pick-up device 110D and the micro-devices 10 to pick up the micro-devices 10.

With reference to FIG. 5B and FIG. 5C, the carrier 20D is removed, so as to separate the carrier 20D from the micro-devices 10 snapped by the caves 112. In the present embodiment, while the carrier 20D is being separated from the micro-devices 10, the first magnetic force F1 can be applied to attract the micro-devices 10, so as to keep the micro-devices 10 in the caves 112. Thereby, the micro-devices 10 are not apt to be moved together with the carrier 20D nor removed from the caves 112.

Figure 5D:
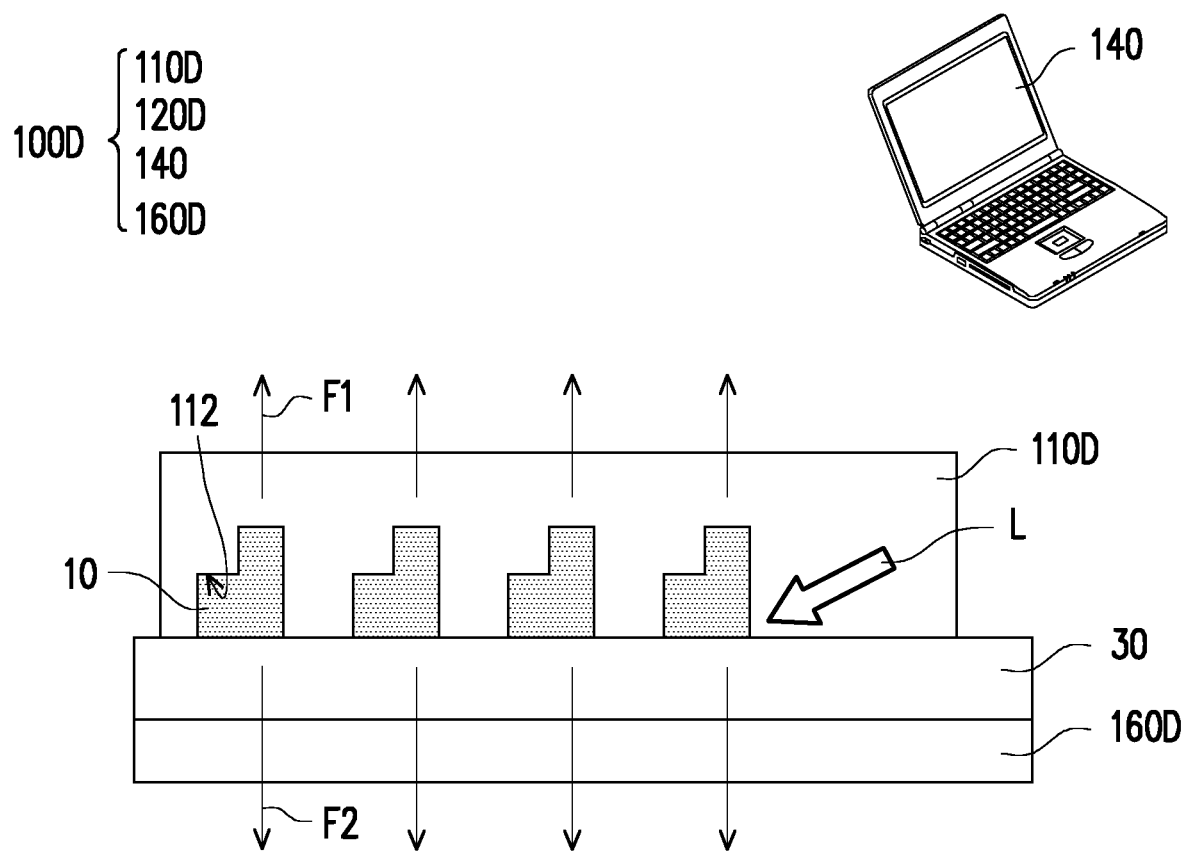
Figure 5E:
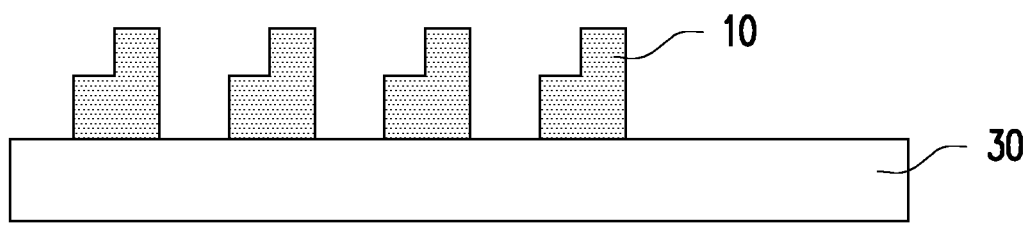

With reference to FIG. 5D-FIG. 5E, after the filling process is completed (i.e., the caves 112 of the pick-up device 110D are respectively filled with the micro-devices 10), a bonding process is then performed. With reference to FIG. 5D, first, the micro-devices 10 are separated from the caves 112 of the pick-up device 110D. In the present embodiment, the second magnetic force F2 can be provided to separate the micro-devices 10 from the caves 112 of the pick-up device 110D. In the present embodiment, the second magnetic force F2 is provided by the second magnetic device 160D, and the second magnetic device 160D can be designed to be of a plate shape or a block shape to comply with the shape of the pick-up device 110D (i.e., shaped as a planar intaglio plate for gravure printing), which should however not be construed as a limitation in the disclosure.

With reference to FIG. 5D and FIG. 5E, in the present embodiment, before the micro-devices 10 are separated from the caves 112 and/or while the micro-devices 10 are being separated from the caves 112, laser L may be optionally utilized to melt a solder material (not shown) formed on the micro-devices 10 and/or the receiving device 30 in advance. Thereby, while the micro-devices 10 are being transferred from the caves 112 to the receiving device 30, the micro-devices 10 can be electrically connected to the receiving device 30, which should however not be construed as a limitation in the disclosure.

Figure 6:
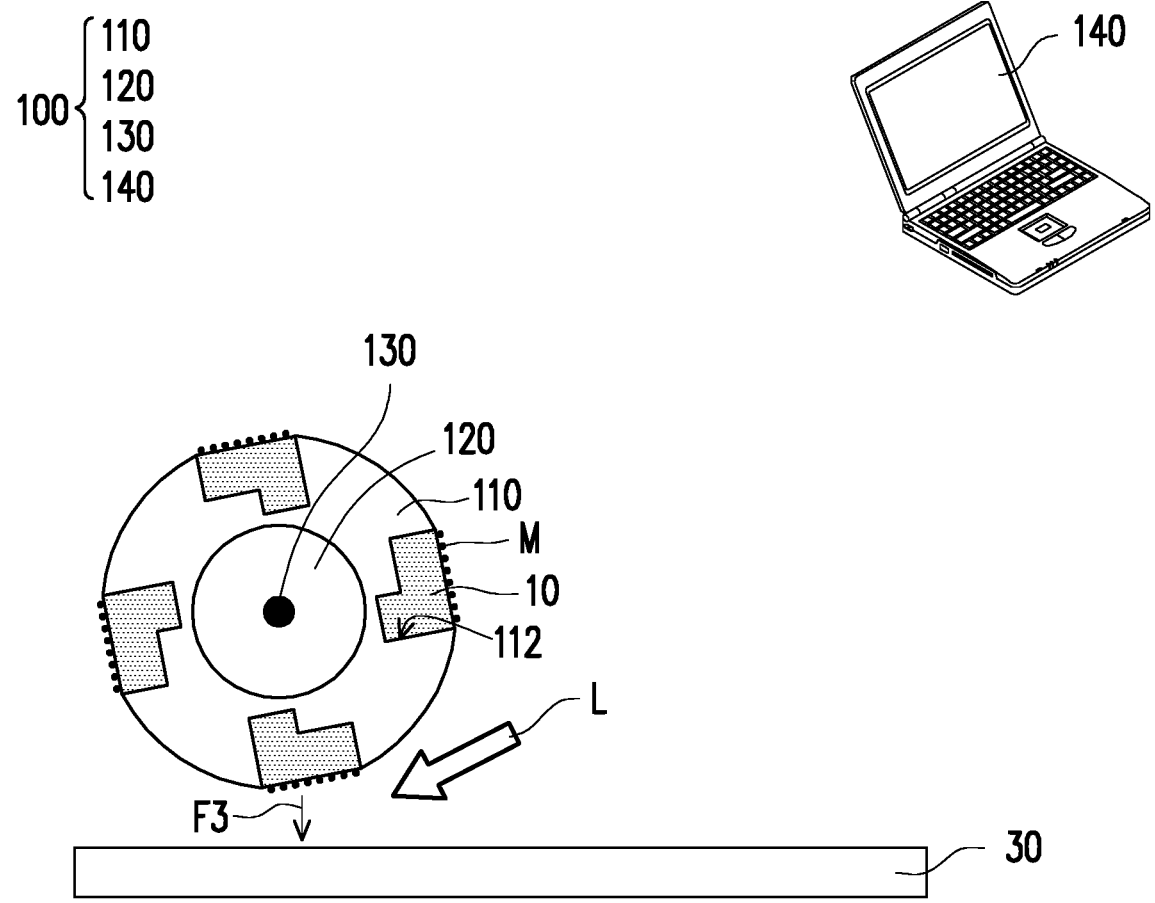
FIG. 6 illustrates parts of a process of transferring a plurality of micro-devices according to still another embodiment of the disclosure.

FIG. 6 illustrates parts of a process of transferring a plurality of micro-devices according to still another embodiment of the disclosure. In particular, FIG. 6 shows another method of separating the micro-devices 10 from the caves of the pick-up device 110. In the embodiment depicted in FIG. 6, the micro-devices 10 have a magnetic material M (e.g., including but not limited to: magnetic powder). When it is intended to separate a batch of micro-devices 10 from the caves 112, first magnetic device 120 may not provide the first magnetic force F1 attracting the batch of micro-devices 10 but provide a third magnetic force F3 repelling the micro-devices 10. Thereby, the transfer apparatus 100 can release the micro-devices 10 from the caves 112 of the pick-up device 110 and further transfer the pick-up device 110 to the receiving device 30. The method of separating the micro-devices 10 from the caves 112 as shown in FIG. 6 can be configured to replace the method of separating the micro-devices 10 from the caves 112 as shown in FIG. 1D.

Figure 7:
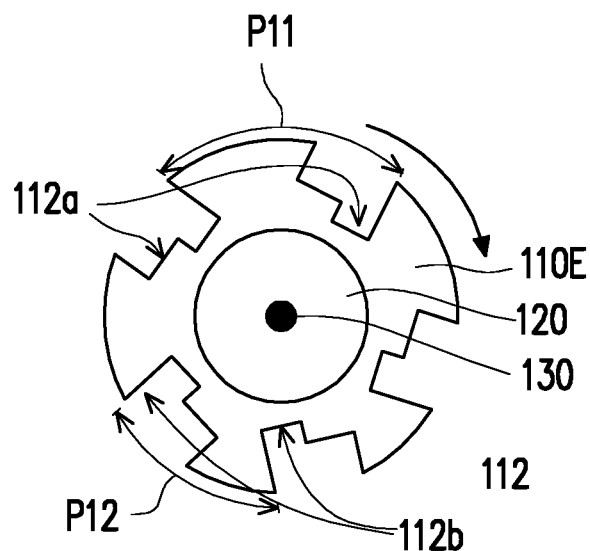
FIG. 7 illustrates a pick-up device of a transfer apparatus according to another embodiment of the disclosure.
Figure 7:
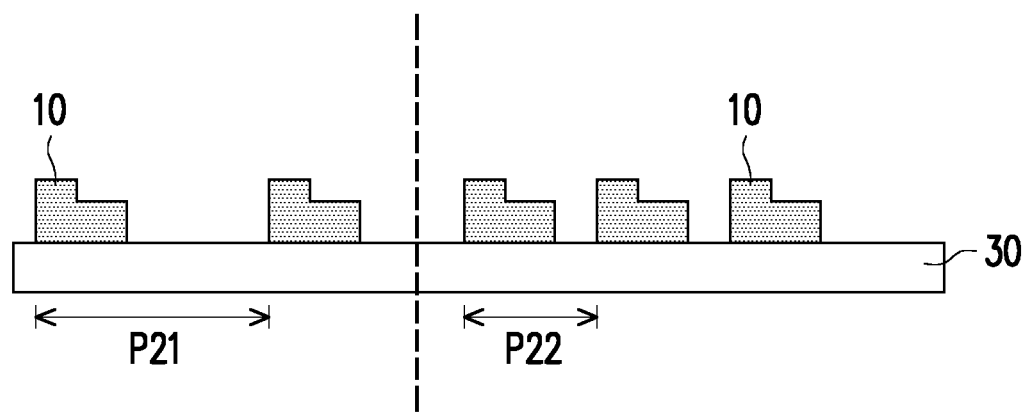

FIG. 7 illustrates a pick-up device 110E of a transfer apparatus according to another embodiment of the disclosure. The difference between the pick-up device 110E depicted in FIG. 7 and the pick-up device 110 depicted in FIG. 1F lies in that: the caves 112 of the pick-up device 110 shown in FIG. 1F are arranged at the same interval P1, while the caves 112a and 112b of the pick-up device 110E shown in FIG. 7 can be arranged at different intervals P11 and P12. In particular, in the embodiment depicted in FIG. 7, the pick-up device 110E has a first region and a second region outside the first region, the caves 112a of the pick-up device 110E on the first region are arranged at the first interval P11 in a movement direction of the pick-up device 110E, the caves 112b of the pick-up device 110E on the second region are arranged at the second interval P12 in a movement direction of the pick-up device 110E, and the first interval P11 is different from the second interval P12.

In the embodiment depicted in FIG. 1F, after the caves 112 of the pick-up device 110 are applied to transfer the micro-devices 10 to the receiving device 30, the micro-devices 10 disposed on the receiving device 30 are arranged at the same interval P2, wherein the interval P2 is substantially equal to the interval P1. If the micro-devices 10 and the receiving device 30 are electrically connected to each other to form the LED display panel, the LED display panel has one single resolution.

However, according to the embodiment depicted in FIG. 7, after the caves 112a and 112b of the pick-up device 110E are applied to transfer the micro-devices 10 to the receiving device 30, the micro-devices 10 disposed on the first region of the receiving device 30 are arranged at the interval P21, and the micro-devices 10 disposed on the second region of the receiving device 30 are arranged at the interval P22, wherein the interval P21 is substantially equal to the first interval P11, the interval P22 is substantially equal to the second interval P12, and the interval P21 is different from the interval P22. Thereby, after the micro-devices 10 is transferred to the receiving device 30 and electrically connected to the receiving device 30, the first region of the receiving device 30 (e.g., the left region of the receiving device 30) is separated from the second region of the receiving device 30 (e.g., the right region of the receiving device 30), so as to obtain a variety of LED display panels with different resolutions.

Figure 8:
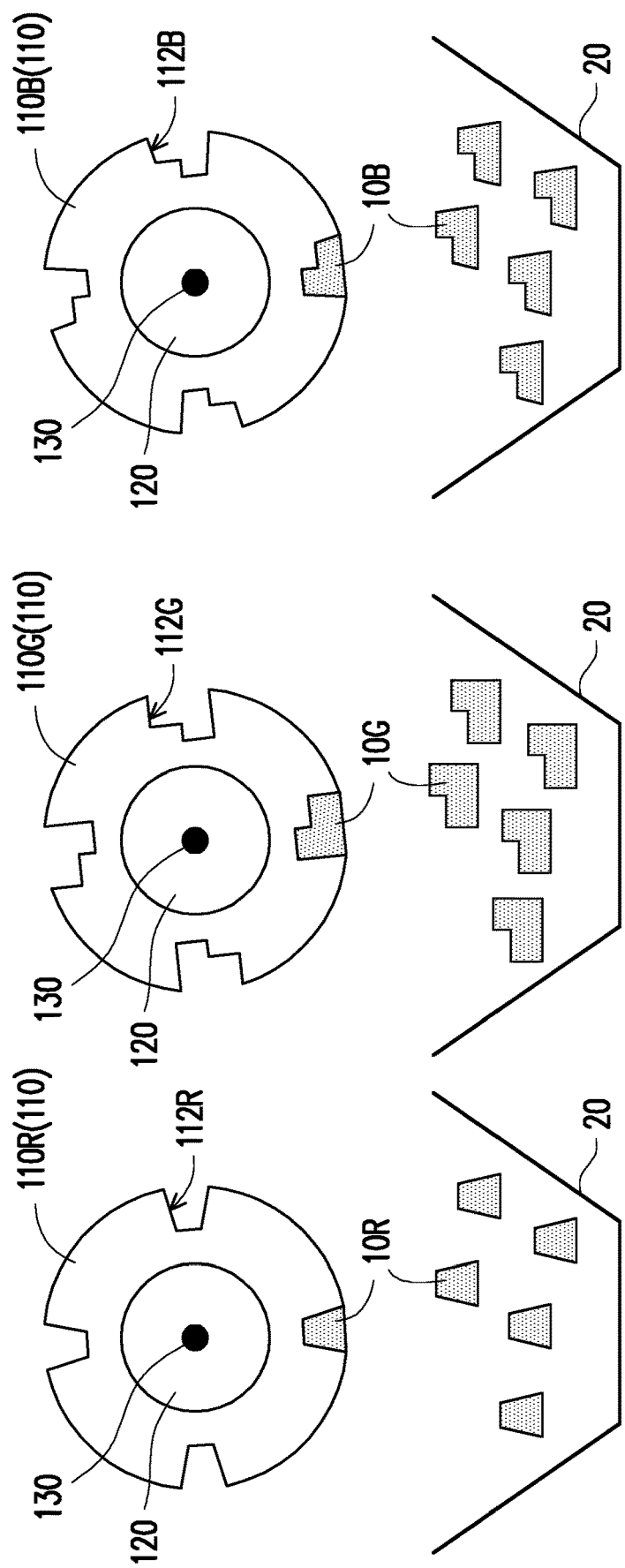
FIG. 8 illustrates a plurality of pick-up devices of a transfer apparatus according to an embodiment of the disclosure.

FIG. 8 illustrates a plurality of pick-up devices of a transfer apparatus according to an embodiment of the disclosure. In the embodiment depicted in FIG. 8, the to-be-transferred micro-devices 10R, 10G, and 10B include a plurality of first micro-devices 10R, a plurality of second micro-devices 10G, and a plurality of third micro-devices 10B. The first micro-devices 10R, the second micro-devices 10G, and the third micro-devices 10B are, for instance, LEDs respectively configured to emit a first color beam, a second color beam, and a third color beam.

The first color beam, the second color beam, and the third color beam are different from one another. For instance, the first color beam, the second color beam, and the third color beam can be a red beam, a green beam, and a blue beam, which should however not be construed as limitations in the disclosure.

In the embodiment depicted in FIG. 8, a shape of the first micro-devices 10R, a shape of the second micro-devices 10G, and a shape of the third micro-devices 10B are different from one another. The pick-up device 110 includes a first pick-up device 110R, a second pick-up device 110G, and a third pick-up device 110B respectively having a plurality of first caves 112R, a plurality of second caves 112G, and a plurality of third caves 112B. A shape of the first caves 112R, a shape of the second caves 112G, and a shape of the third caves 112B are different from one another, and the shape of the first caves 112R, the shape of the second caves 112G, and the shape of the third caves 112B respectively correspond to the shape of the first micro-devices 10R, the shape of the second micro-devices 10G, and the shape of the third micro-devices 10B.

In the embodiment depicted in FIG. 8, the first micro-devices 10R, the second micro-devices 10G, and the third micro-devices 10B can be respectively disposed in different carriers 20, and the first pick-up devices 110R, the second pick-up devices 110G, and the third pick-up devices 110B are applied to pick up the first micro-devices 10R, the second micro-devices 10G, and the third micro-devices 10B, respectively. People having ordinary skill in the pertinent art should be able to apply the pick-up devices 110R, 110B, and 110G depicted in FIG. 8 in the aforesaid process of transferring the micro-devices according to FIG. 8 and the descriptions provided above, and therefore no further explanation is provided hereinafter.

Figure 9:
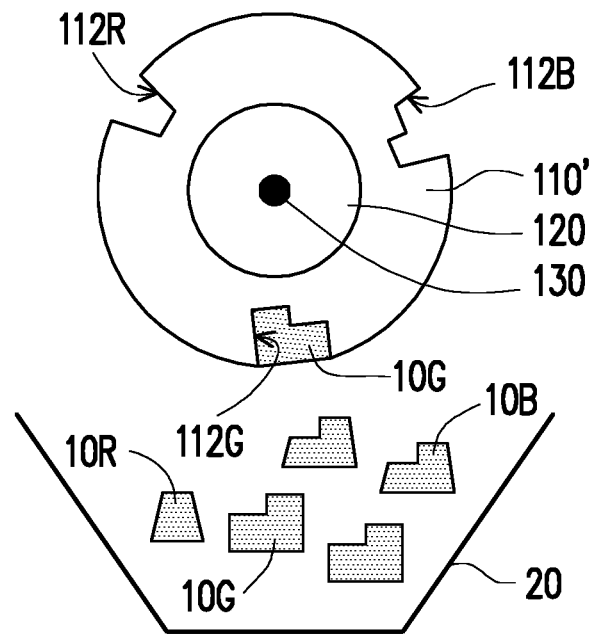
FIG. 9 illustrates a pick-up device of a transfer apparatus according to another embodiment of the disclosure.

FIG. 9 illustrates a pick-up device of a transfer apparatus according to another embodiment of the disclosure. The pick-up device 110' depicted in FIG. 9 has the first caves 112R of the first pick-up devices 110R, the second caves 112G of the second pick-up devices 110G, and the third caves 112B of the third pick-up devices 110B. In the embodiment depicted in FIG. 9, the first micro-devices 10R, the second micro-devices 10G, and the third micro-devices 10B can be disposed in the same carrier 20, and one single pick-up device 110' having different caves 112R, 112G, and 112B is applied to pick up the first micro-devices 10R, the second micro-devices 10G, and the third micro-devices 10B in one pick-up process. People having ordinary skill in the pertinent art should be able to apply the pick-up device 110' depicted in FIG. 9 in the aforesaid process of transferring the micro-devices according to FIG. 9 and the descriptions provided above, and therefore no further explanation is provided hereinafter.

Figure 10:
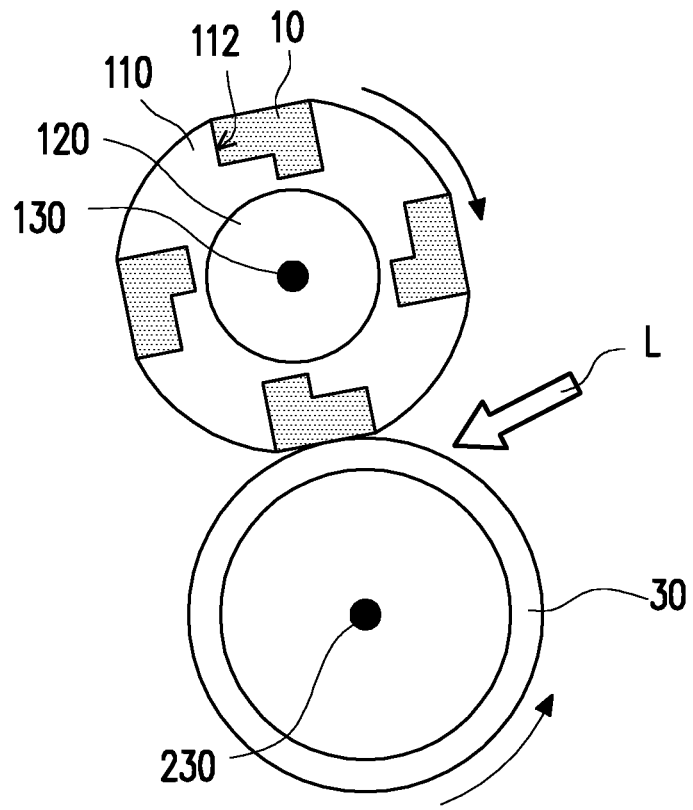
FIG. 10 illustrates a process of transferring a plurality of micro-devices to a receiving device according to still another embodiment of the disclosure.

FIG. 10 illustrates a process of transferring a plurality of micro-devices to a receiving device according to still another embodiment of the disclosure. In the embodiment depicted in FIG. 10, the receiving device 30 has flexibility. The receiving device 30 having flexibility may be made of, e.g., polyimide or a plastic thin film (poly(ethylene terephthalate), PET), a poly(ethylene naphthalate) (PEN) film, polyethersulfone (PES), ultra-thin glass, or metal foil, and the receiving device 30 can be disposed on the receiving roller 230. The receiving roller 230 is configured to drive the receiving device 30 to move relative to the micro-devices 10 snapped by the caves 112 of the pick-up device 110, so as to further transfer the micro-devices 10 snapped by the caves 112 of the pick-up device 110 to the receiving device 30. To sum up, according to the present embodiment, the micro-devices 10 are transferred in a roll to roll manner, and thus the micro-devices 10 can be transferred rapidly and efficiently.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A transfer method comprising:
   providing a pick-up device having a plurality of caves;
   providing a first magnetic force configured to attract a plurality or micro-devices to move toward the plurality of caves of the pick-up device;
   given that the first magnetic force is provided, having the pick-up device compress the plurality of micro-devices, so as to fit in place the plurality of micro-devices into the plurality of caves of the pick-up device, wherein a shape of the plurality of caves is the same as a shape of the plurality of micro-devices;
   transferring the plurality of micro-devices from the plurality of caves of the pick-up device to a receiving device; and
   arranging the pick-up device on a pick-up roller, wherein the pick-up roller is configured to drive the plurality of caves of the pick-up device to move relative to the plurality of micro-devices.

2. The transfer method according to claim 1, wherein each of the plurality of micro-devices has a magnetic material.

3. The transfer method according to claim 1, further comprising:
   arranging the receiving device on a receiving roller, wherein the receiving roller is configured to drive the receiving device to move relative to the plurality of micro-devices fitted in place into the plurality of caves.

4. The transfer method according to claim 1, wherein a portion of at least one of the plurality of micro-devices fitted in place into the plurality of caves is located outside the plurality of caves, and the transfer method further comprises:
   before the plurality of micro-devices are transferred to the receiving device, removing at least one of the plurality of micro-devices.

5. The transfer method according to claim 1, wherein the step of having the plurality of micro-devices transfer from the plurality of caves of the pick-up device to the receiving device comprises:
   providing a second magnetic force, so as to separate the plurality of micro-devices from the plurality of caves of the pick-up device.

6. The transfer method according to claim 5, wherein a direction of the first magnetic force and a direction of the second magnetic force are opposite to each other, and a magnitude of the second magnetic force is greater than a magnitude of the first magnetic force.

7. The transfer method according to claim 1, the plurality of caves comprising a plurality of first caves and a plurality of second caves, the plurality of first caves being spaced from each other by a first interval, the plurality of second caves being spaced from each other by a second interval, the first interval being different from the second interval.

8. The transfer method according to claim 1, the plurality of caves comprising a first cave and a second cave, a shape of the first cave being different from a shape of the second cave, the plurality of micro-devices comprising a first micro-device and a second micro-device, a shape of the first micro-device being different from a shape of the second micro-device, wherein the shape of the first micro-device corresponds to the shape of the first cave, and the shape of the second micro-device corresponds to the shape of the second cave.

9. A transfer apparatus configured to transfer a plurality of micro-devices and comprising:
   a pick-up device having a plurality of caves;
   a first magnetic device, wherein at least a part of the pick-up device is disposed between the first magnetic device and the plurality of micro-devices, the first magnetic device is configured to provide a first magnetic force, the first magnetic force is configured to attract the plurality of micro-devices to move toward the plurality of caves of the pick-up device;
   a control device, given that the first magnetic device provides the first magnetic force, the pick-up device compressing the plurality of micro-devices, so as to fit in place the plurality of micro-devices into the plurality of caves of the pick-up device, wherein a shape of the plurality of caves is the same as a shape of the plurality of micro-devices; and
   a pick-up roller, wherein the pick-up device is disposed on the pick-up roller, and the control device has the pick-up roller drive the plurality of caves of the pick-up device to move relative to the plurality of micro-devices.

10. The transfer apparatus according to claim 9, the plurality of caves comprising a plurality of first caves and a plurality of second caves, the plurality of first caves being spaced from each other by a first interval, the plurality of second caves being spaced from each other by a second interval, the first interval being different from the second interval.

11. The transfer apparatus according to claim 9, the plurality of caves comprising a first cave and a second cave, a shape of the first cave being different from a shape of the second cave, the plurality of micro-devices comprising a first micro-device and a second micro-device, a shape of the first micro-device being different from a shape of the second micro-device, wherein the shape of the first micro-device corresponds to the shape of the first cave, and the shape of the second micro-device corresponds to the shape of the second cave.

12. The transfer apparatus according to claim 9, further comprising:
   a receiving roller;
   a receiving device disposed on the receiving roller, wherein the control device has the receiving roller drive the receiving device to move relative to the plurality of micro-devices fitted in place into the plurality of caves.

13. The transfer apparatus according to claim 9, wherein a portion of at least one of the plurality of micro-devices fitted in place into the plurality of caves is located outside the plurality of caves, and the transfer apparatus further comprises:
   a removal device, wherein the control device has the removal device remove the at least one of the plurality of micro-devices.

14. The transfer apparatus according to claim 9, further comprising:
   a second magnetic device configured to provide a second magnetic force, so as to separate the plurality of micro-devices from the plurality of caves of the pick-up device.

15. The transfer apparatus according to claim 14, wherein a direction of the first magnetic force and a direction of the second magnetic force are opposite to each other, and a magnitude of the second magnetic force is greater than a magnitude of the first magnetic force.

16. The transfer apparatus according to claim 9, wherein the first magnetic device is configured to provide a third magnetic force, so as to separate the plurality of micro-devices from the plurality of caves of the pick-up device.

* * * * *